United States Patent
Kawai et al.

(10) Patent No.: US 7,463,236 B2
(45) Date of Patent: Dec. 9, 2008

(54) DRIVER CIRCUIT

(75) Inventors: Shuhei Kawai, Gunma (JP); Takashige Ogata, Gunma (JP); Tatsuya Suzuki, Kumagaya (JP)

(73) Assignee: Sanyo Electric Co., Ltd., Osaka (JP)

( * ) Notice: Subject to any disclaimer, the term of this patent is extended or adjusted under 35 U.S.C. 154(b) by 547 days.

(21) Appl. No.: 11/091,342

(22) Filed: Mar. 29, 2005

(65) Prior Publication Data

US 2005/0218970 A1 Oct. 6, 2005

(30) Foreign Application Priority Data

Mar. 30, 2004 (JP) ............................. 2004-097607

(51) Int. Cl.
G09G 3/36 (2006.01)
(52) U.S. Cl. ..................................... 345/102
(58) Field of Classification Search .................. 345/103, 345/102

See application file for complete search history.

(56) References Cited

U.S. PATENT DOCUMENTS

| | | |
|---|---|---|
| 6,400,210 B2 | 6/2002 | Myono |
| 6,841,948 B2 * | 1/2005 | Yoshida .................... 315/169.3 |
| 2003/0169220 A1 | 9/2003 | Tsuchiya et al. |
| 2004/0041780 A1 * | 3/2004 | Ko ............................. 345/102 |
| 2004/0056605 A1 | 3/2004 | Yoshida |
| 2004/0227706 A1 * | 11/2004 | Sung ........................... 345/76 |
| 2005/0068272 A1 * | 3/2005 | Yoneda ........................ 345/76 |

FOREIGN PATENT DOCUMENTS

| | | |
|---|---|---|
| JP | 2001-231249 | 8/2001 |
| TW | 555350 | 9/2003 |

* cited by examiner

*Primary Examiner*—Amr Awad
*Assistant Examiner*—Michael Pervan
(74) *Attorney, Agent, or Firm*—Morrison & Foerster LLP

(57) ABSTRACT

A driver circuit to obtain a current to drive a light emitting device is reduced in a patterning area and improved in efficiency. A positive power supply voltage Vdd is applied to an anode of a white LED, while a voltage −0.5 Vdd from a −0.5 Vdd generation circuit is applied to a cathode of the white LED through an N-channel type MOS transistor. The −0.5 Vdd generation circuit generates the voltage −0.5 Vdd according to a clock Φ from a clock generation circuit. A voltage of 1.5 Vdd is applied between the anode and the cathode of the white LED, as equivalent to a prior art. Since N-channel type MOS transistors are heavily used in the −0.5 Vdd generation circuit, the driver circuit requires less patterning area to obtain the same amount of current to drive the LED as in the prior art. In addition, a parasitic capacitance is reduced to improve efficiency of the driver circuit.

7 Claims, 6 Drawing Sheets

DRIVER CIRCUIT

CROSS-REFERENCE OF THE INVENTION

This invention is based on Japanese Patent Application No. 2004-97607, the content of which is incorporated herein by reference in its entirety.

BACKGROUND OF THE INVENTION

1. Field of the Invention

This invention relates to a driver circuit, specifically to a driver circuit to drive a light emitting device.

2. Description of the Related Art

A white light emitting diode (hereafter referred to as a white LED) has been used as back light for a liquid crystal display panel. The white LED has a VF (forward voltage) ranging from 3.2V to 3.8V. A voltage as high as VF is to be applied across an anode and a cathode of the white LED to drive the white LED to emit light. A power supply voltage ranging from 2.7V to 5.5V, for example, is required for the power supply voltage to the white LED driver circuit. Therefore, when a power supply voltage Vdd is too low, the power supply voltage has been boosted to 1.5 times of Vdd before being supplied to the white LED.

FIG. 6 shows such a driver circuit to drive the white LED. In the circuit shown in FIG. 6, an anode of the white LED 50 is provided with a boosted voltage of 1.5 Vdd from a 1.5 Vdd generation circuit 60, while a cathode of the white LED 50 is provided with a ground voltage Vss (0V) through a driver transistor 70. The 1.5 Vdd generation circuit 60 generates the voltage of 1.5 Vdd from the power supply voltage Vdd. The 1.5 Vdd generation circuit 60 is disclosed in Japanese Patent Publication No. 2001-231249.

However, since the 1.5 Vdd generation circuit 60 heavily uses P-channel type MOS transistors because of restrictions due to structuring of the circuit, there arises a problem that it requires a large patterning area for the driver circuit.

SUMMARY OF THE INVENTION

This invention offers an improved driver circuit in which a negative voltage is generated accordingly to a positive power supply voltage Vdd by a negative voltage generation circuit, an anode of a light emitting device is provided with the positive power supply voltage Vdd and a cathode of the light emitting device is provided with the negative voltage through a driver transistor.

The negative voltage is −0.5 Vdd in the driver circuit described above.

Furthermore, the negative voltage generation circuit described above includes a first switching device to which a ground voltage is applied, a second switching device connected in series with the first switching device, a first capacitor having a terminal to which a clock is provided, a second capacitor having a terminal connected to a connecting point between the first switching device and the second switching device, a third switching device connected between another terminal of the second capacitor and a ground at the ground voltage, a fourth switching device connected between another terminal of the first capacitor and the another terminal of the second capacitor and a fifth switching device connected between the another terminal of the first capacitor and an output terminal of the second switching device, wherein the first and the fourth switching devices are turned on to connect the first and the second capacitors in series between a power supply at a first voltage and the ground through the first switching device and charge the capacitors when the clock is at the first voltage, the fifth switching device is turned on to connect the first capacitor between the ground and the output terminal and discharge the first capacitor and the second and the third switching devices are turned on at the same time to connect the second capacitor between the ground and the output terminal through the second switching device and discharge the second capacitor when the clock is at a second voltage, and at least the first, second, third and the fifth switching devices are formed of N-channel type MOS transistors.

DETAILED DESCRIPTION OF THE INVENTION

Figure 1:
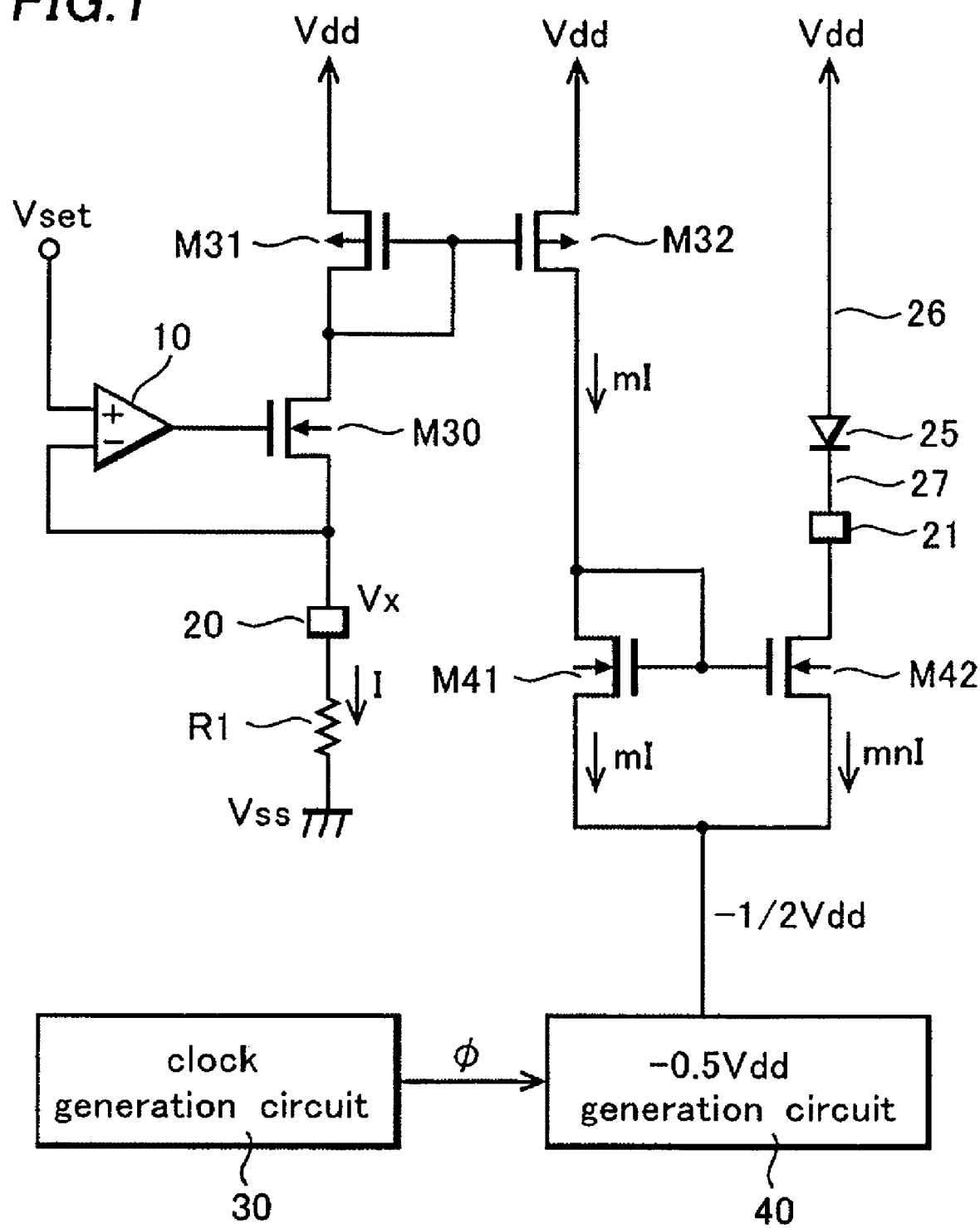
FIG. 1 is a circuit diagram of a driver circuit according to an embodiment of this invention.

Next, an embodiment of this invention will be explained referring to figures hereinafter. FIG. 1 is a circuit diagram of a driver circuit according to the embodiment. A voltage Vset is applied to a positive input terminal (+) of an operational amplifier 10 serving as a voltage follower. An output of the operational amplifier 10 is applied to a gate of an N-channel type MOS transistor M30, and a negative input terminal (−) of the operational amplifier 10 is connected to a source of the N-channel type MOS transistor M30. The source is connected to a terminal 20. An external resistor R1 is connected between the terminal 20 and a ground at a ground voltage Vss. Therefore, a voltage Vx at the terminal 20 is controlled by the operational amplifier 10 so that the voltage Vx is made equal to the voltage Vset, generating a current I (=Vset/R1) flowing through the external resistor R1 as a result. The current I flows through a P-channel type MOS transistor M31 in a first current mirror circuit composed of a pair of P-channel type MOS transistors M31 and M32 (current ratio 1:m).

A current mI is inputted to a second current mirror circuit that is in a form of fold-back of the first current mirror circuit. The second current mirror circuit is composed of a pair of N-channel type MOS transistors M41 and M42 (current ratio 1:n). And a current mnI, that is the current I multiplied by mn, flows through an N-channel type MOS transistor M42 that is a driver transistor. The multiplied current mnI is provided to a white LED 25 that is externally connected to a terminal 21.

A positive power supply voltage Vdd is applied to an anode 26 of the white LED 25, while a voltage −0.5 Vdd from a −0.5 Vdd generation circuit 40 is applied to a cathode 27 of the white LED 25 through an N-channel type MOS transistor M42. The −0.5 Vdd generation circuit 40 generates the voltage −0.5 Vdd according to a clock Φ from a clock generation circuit 30.

Figure 6:
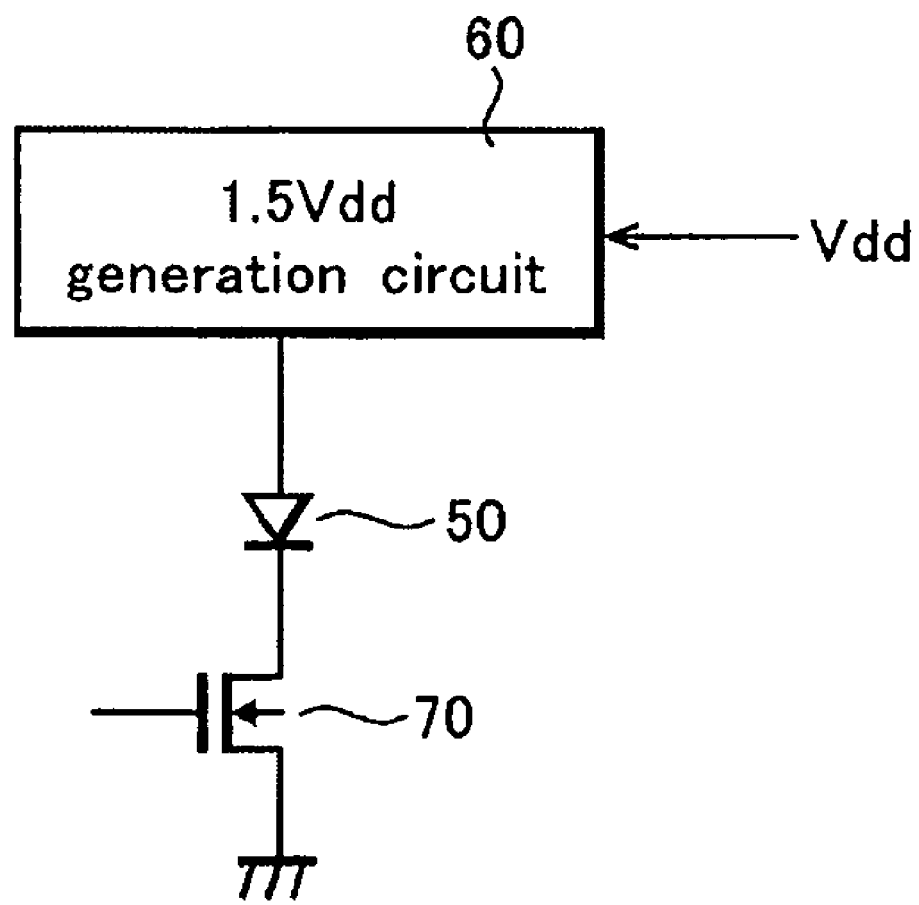
FIG. 6 is a circuit diagram of a driver circuit according to the prior art.

Therefore, according to the embodiment, a voltage of 1.5 Vdd is applied between the anode 26 and the cathode 27 of the white LED 25, as equivalent to the driver circuit of FIG. 6. In addition, it is made possible to drive a large current with the N-channel type MOS transistor M42 serving as the driver transistor. Also, since N-channel type MOS transistors are heavily used in the −0.5 Vdd generation circuit 40 as will be described below, the driver circuit takes a reduced patterning area to obtain the same amount of current mnI to drive the LED 25 as in the prior art, further improving the efficiency.

Figure 2A:
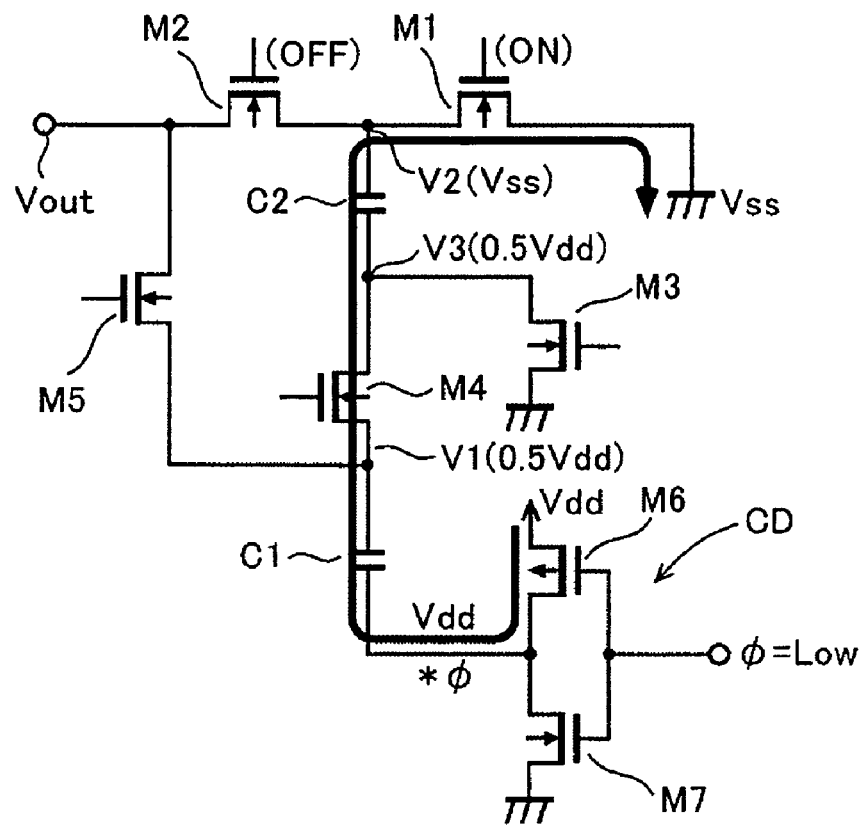
FIGS. 2A and 2B are circuit diagrams of a −0.5 Vdd generation circuit according to the embodiment of this invention.
Figure 2B:
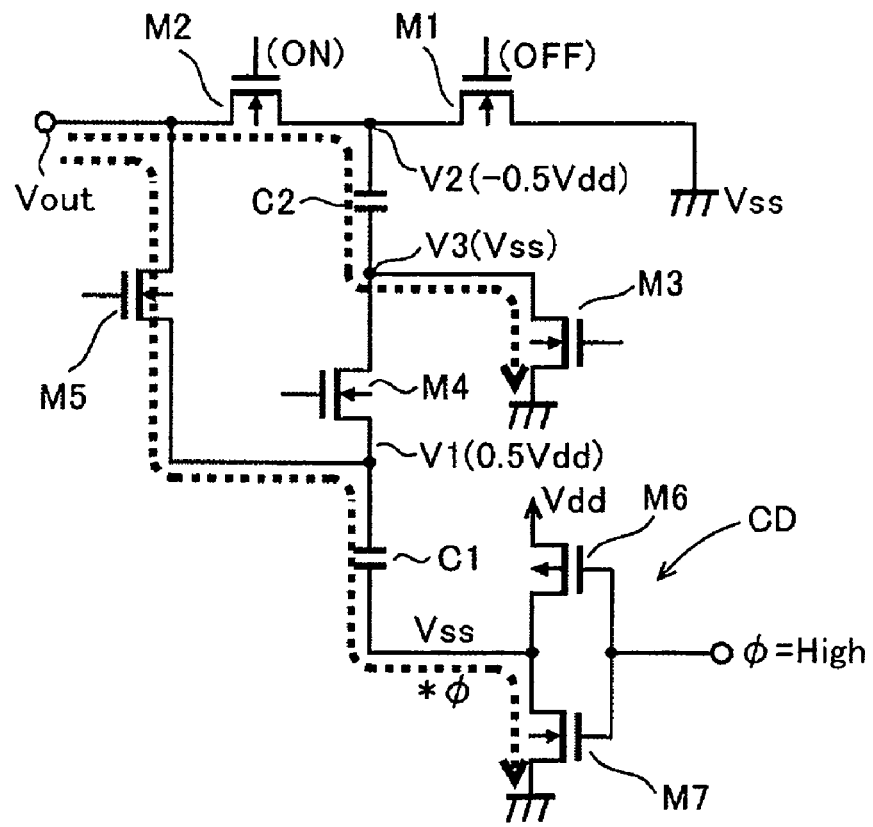

Next, a concrete structure and operation of the −0.5 Vdd generation circuit 40 will be explained referring to figures. FIGS. 2A and 2B are circuit diagrams of the −0.5 Vdd generation circuit 40. FIG. 2A shows a status of the circuit when the clock Φ inputted to a clock driver CD is at a low level, while FIG. 2B shows a status of the circuit when the clock Φ is at a high level. The ground voltage Vss (0V) is applied to a source of a first switching MOS transistor M1. A drain of the first switching MOS transistor M1 is connected to a source of a second switching MOS transistor M2. The first switching MOS transistor M1 and the second switching MOS transistor M2 serve as charge transfer devices.

Both the first switching MOS transistor M1 and the second switching MOS transistor M2 are N-channel type. The reason is to obtain voltages to turn on and off the first switching MOS transistor M1 and the second switching MOS transistor M2 from voltages available within the circuit. The power supply voltage Vdd is applied to gates of the first switching MOS transistor M1 and the second switching MOS transistor M2 to turn them on, and an output voltage Vout (=−0.5 Vdd) of the circuit is applied to the gates to turn them off.

An output of the clock driver CD is connected to a terminal of a first capacitor C1. The clock driver CD is a CMOS inverter composed of a P-channel type MOS transistor M6 and an N-channel type MOS transistor M7 connected in series between the power supply Vdd and the ground Vss. The clock Φ is inputted to the clock driver CD and is inverted by the clock driver CD. A reverse clock *Φ that is the output of the clock driver is applied to the terminal of the first capacitor C1.

Alternatively, a clock Φ' made by delaying the clock Φ may be applied to a gate of the N-channel type MOS transistor M7 while the clock Φ is applied to a gate of the P-channel type MOS transistor M6 in order to reduce a through-current flowing through the clock driver CD. A terminal of a second capacitor C2 is connected to a connecting point between the first switching MOS transistor M1 and the second switching MOS transistor M2. A third switching MOS transistor M3 is connected between another terminal of the second capacitor C2 and the ground Vss (0V).

A fourth switching MOS transistor M4 is connected between another terminal of the first capacitor C1 and the another terminal of the second capacitor C2. A fifth switching MOS transistor M5 is connected between the another terminal of the first capacitor C1 and an output terminal that is a drain of the second switching MOS transistor M2. The output voltage Vout (=−0.5 Vdd) of the circuit is obtained from the drain of the second switching MOS transistor M2.

The third switching MOS transistor M3 and the fifth switching MOS transistor M5 are N-channel type. The reason is to obtain voltages to turn on and off the third switching MOS transistor M3 and the fifth switching MOS transistor M5 from voltages available within the circuit, as in the case of the first switching MOS transistor M1 and the second switching MOS transistor M2. That is, the power supply voltage Vdd is applied to gates of the third switching MOS transistor M3 and the fifth switching MOS transistor M5 to turn them on, and the output voltage Vout (=−0.5 Vdd) of the circuit is applied to the gates to turn them off.

Although the fourth switching MOS transistor M4 may be either P-channel type or N-channel type, N-channel type is preferable to reduce a patterning area. The power supply voltage Vdd is applied to a gate of the fourth switching MOS transistor M4 to turn it on and the output voltage Vout (=−0.5 Vdd) of the circuit is applied to the gate to turn it off, when the fourth switching MOS transistor M4 is N-channel type. The ground voltage Vss or the output voltage Vout is applied to the gate of the fourth switching MOS transistor M4 to turn it on and the power supply voltage Vdd is applied to the gate to turn it off, when the fourth switching MOS transistor M4 is P-channel type.

It is assumed that a capacitance of the first capacitor C1 and a capacitance of the second capacitor C2 are equal to each other. Turning on and off of the first switching MOS transistor M1, the second switching MOS transistor M2, the third switching MOS transistor M3, the fourth switching MOS transistor M4 and the fifth switching MOS transistor M5 are controlled by controlling their gate voltages with a control circuit that is not shown in the figure according to a voltage level of the clock Φ, as will be described below.

Figure 3:
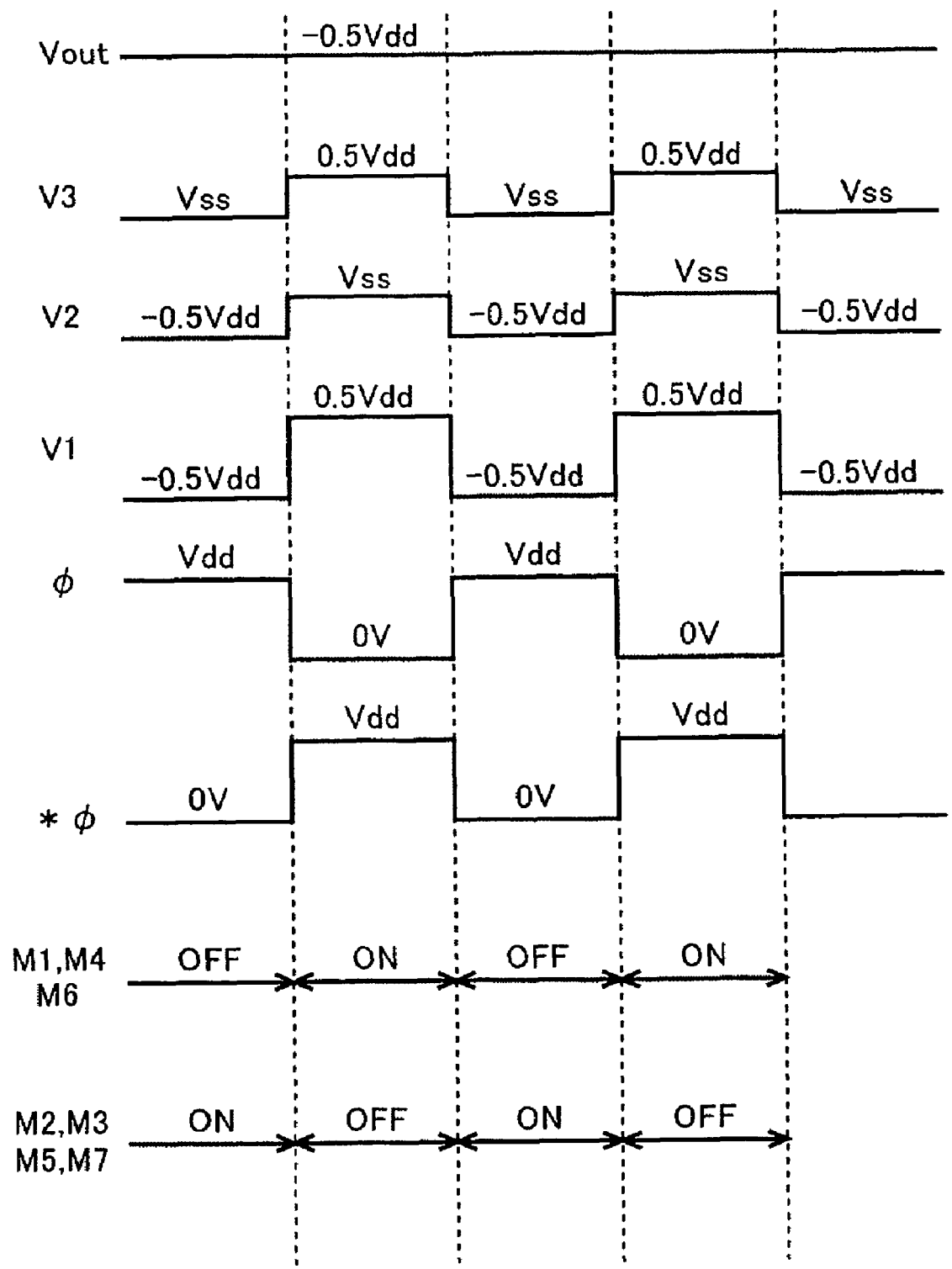
FIG. 3 is a timing chart showing operation of the −0.5 Vdd generation circuit according to the embodiment of this invention.

Next, operation of the −0.5 Vdd generation circuit 40 will be explained referring to FIGS. 2A and 2B and FIG. 3. FIG. 3 is a timing chart showing the operation of the −0.5 Vdd generation circuit 40 in a stationary state.

The operation of a charge pump circuit when the clock Φ is at a low level will be described first (Refer to FIG. 2A and FIG. 3.). Since the P-channel type MOS transistor M6 of the clock driver CD is turned on while the N-channel type MOS transistor M7 is turned off, the reverse clock *Φ is at a high level (Vdd). The first switching MOS transistor M1 and the fourth switching MOS transistor M4 are turned on while the second switching MOS transistor M2, the third switching MOS transistor M3 and the fifth switching MOS transistor M5 are turned off.

As a result, the P-channel type MOS transistor M6 of the clock driver CD, the first capacitor C1, the fourth switching MOS transistor M4, the second capacitor C2 and the first switching MOS transistor M1 are connected in series between the power supply Vdd and the ground Vss as indicated with a solid bold line in FIG. 2A, and the first capacitor C1 and the second capacitor C2 are charged.

The terminal of the first capacitor C1 is charged to Vdd, a voltage V1 at the another terminal of the first capacitor C1 is charge to +0.5 Vdd and a voltage V3 at the another terminal of the second capacitor C2 is also charged to +0.5 Vdd.

The operation of the circuit when the clock Φ is at the high level will be described next (Refer to FIG. 2B and FIG. 3.). Since the N-channel type MOS transistor M7 of the clock driver CD is turned on while the P-channel type MOS transistor M6 is turned off, the reverse clock *Φ is at the low level (Vss). The first switching MOS transistor M1 and the fourth switching MOS transistor M4 are turned off while the second switching MOS transistor M2, the third switching MOS transistor M3 and the fifth switching MOS transistor M5 are turned on.

As a result, −0.5 Vdd is provided to the output terminal through two paths indicated with dashed bold lines in FIG. 2B. Charges in the second capacitor C2 is discharged to provide the output terminal with −0.5 Vdd through one of the paths that runs from the ground Vss to the output terminal through the third switching MOS transistor M3, the second capacitor C2 and the second switching MOS transistor M2. The voltage V3 at the another terminal of the second capacitor C2 has been charged to +0.5 Vdd when the clock Φ is at the low level. A voltage V2 at the terminal of the second capacitor C2 is pulled down from Vss (0V) to −0.5 Vdd by capacitive coupling through the second capacitor C2 when the voltage V3 varies from +0.5 Vdd to Vss by turning-on of the third switching MOS transistor M3.

Charges in the first capacitor C1 is discharged to provide the output terminal with −0.5 Vdd through another of the paths that runs from the ground Vss to the output terminal through the N-channel type MOS transistor M7 of the clock driver CD, the first capacitor C1 and the fifth switching MOS transistor M5. The voltage V1 at the another terminal of the first capacitor C1 has been charged to +0.5 Vdd when the clock Φ is at the low level. The voltage V1 at the another terminal of the first capacitor C1 is pulled down from +0.5 Vdd to −0.5 Vdd by capacitive coupling through the first capacitor C1 when the voltage at the terminal of the first capacitor C1 varies from Vdd to Vss by turning-on of the N-channel type MOS transistor M7.

The output voltage Vout of −0.5 Vdd that is the power supply voltage Vdd multiplied by −0.5 is obtained by alternately repeating the operation when the clock Φ is at the low level and the operation when the clock Φ is at the high level.

Because N-channel type MOS transistors are heavily used in the −0.5 Vdd generation circuit 40 adopted in the embodiment, the driver circuit requires less patterning area to obtain the same amount of current mnI to drive the LED 25 as in the prior art, leading to an improved efficiency.

Figure 4A:
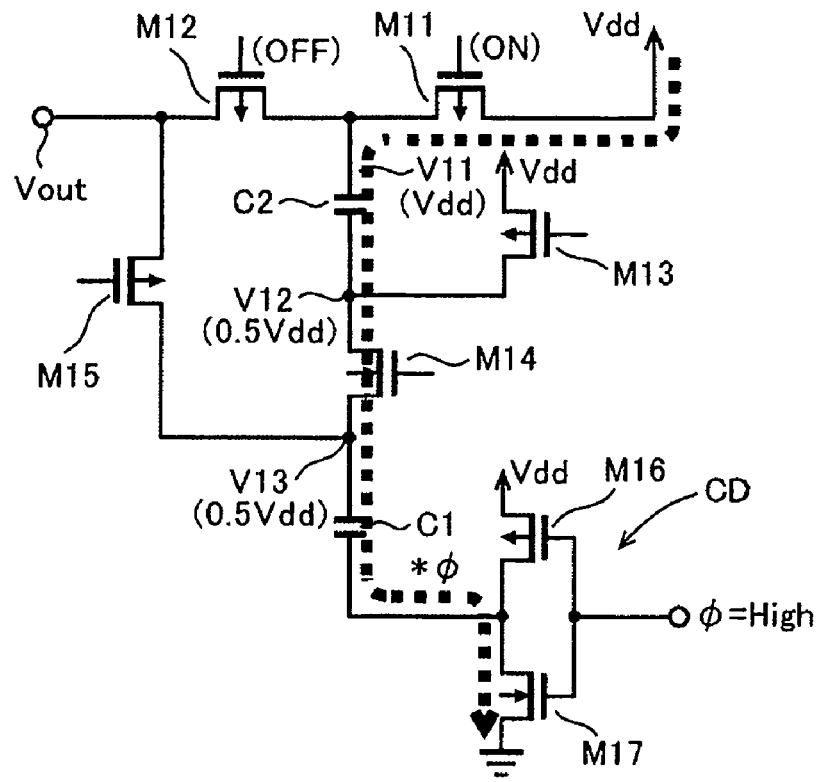
FIGS. 4A and 4B are circuit diagrams of a 1.5 Vdd generation circuit according to a prior art.
Figure 4B:
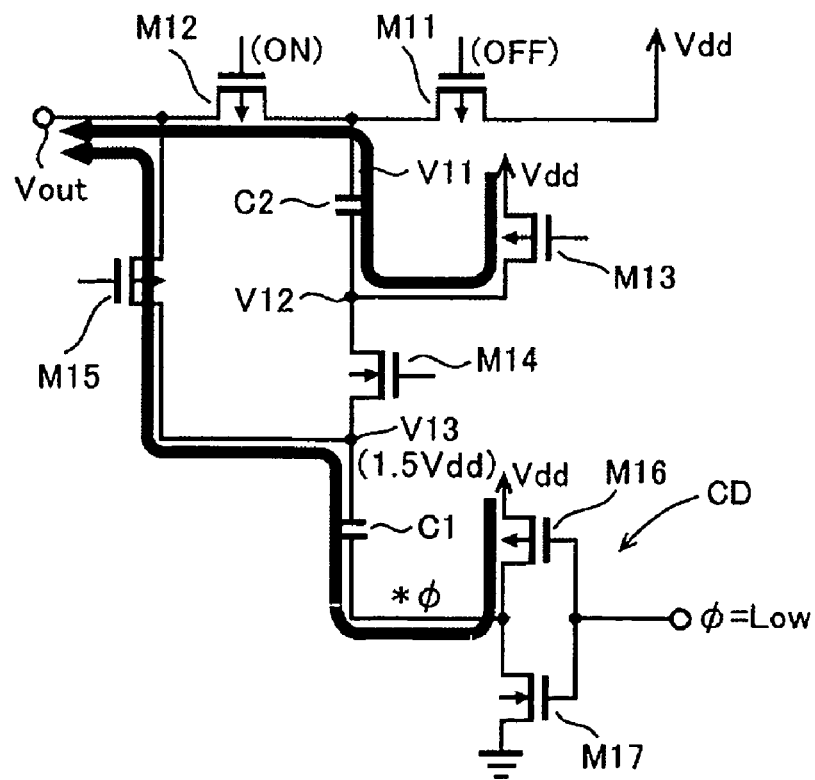

Next, the −0.5 Vdd generation circuit 40 is compared with the 1.5 Vdd generation circuit 60, in order to show the effect of this invention more clearly. A concrete structure of the 1.5 Vdd generation circuit 60 will be explained for this purpose, referring to FIGS. 4A and 4B. FIG. 4A shows a status of the circuit when a clock Φ inputted to a clock driver CD is at a high level, while FIG. 4B shows a status of the circuit when the clock Φ is at a low level.

The power supply voltage Vdd is applied to a source of a first switching MOS transistor M11. A drain of the first switching MOS transistor M11 is connected to a source of a second switching MOS transistor M12. The first switching MOS transistor M11 and the second switching MOS transistor M12 serve as charge transfer devices.

Both the first switching MOS transistor M11 and the second switching MOS transistor M12 are P-channel type. The reason is to obtain voltages to turn on and off the first switching MOS transistor M11 and the second switching MOS transistor M12 from voltages available within the circuit. The ground voltage Vss is applied to gates of the first switching MOS transistor M11 and the second switching MOS transistor M12 to turn them on, and an output voltage Vout (=1.5 Vdd) of the circuit is applied to the gates to turn them off.

An output of a clock driver CD is connected to a terminal of a first capacitor C1. The clock driver CD is a CMOS inverter composed of a P-channel type MOS transistor M16 and an N-channel type MOS transistor M17 connected in series between the power supply Vdd and the ground Vss. The clock Φ is inputted to the clock driver CD and inverted by the clock driver CD. A reverse clock *Φ that is the output of the clock driver is applied to the terminal of the first capacitor C1.

A terminal of a second capacitor C2 is connected to a connecting point between the first switching MOS transistor M11 and the second switching MOS transistor M12. A third switching MOS transistor M13 is connected between another terminal of the second capacitor C2 and the power supply Vdd.

A fourth switching MOS transistor M14 is connected between another terminal of the first capacitor C1 and the another terminal of the second capacitor C2. A fifth switching MOS transistor M15 is connected between the another terminal of the first capacitor C1 and an output terminal that is a drain of the second switching MOS transistor M12. The output voltage Vout (=1.5 Vdd) of the circuit is obtained from the drain of the second switching MOS transistor M12.

The third switching MOS transistor M13 and the fifth switching MOS transistor M15 are P-channel type, while the fourth switching MOS transistor M14 is N-channel type. The reason why the third switching MOS transistor M13 and the fifth switching MOS transistor M15 are P-channel type is to obtain voltages to turn on and off the third switching MOS transistor M3 and the fifth switching MOS transistor M5 from voltages available within the circuit, as described above.

It is assumed that a capacitance of the first capacitor C1 and a capacitance of the second capacitor C2 are equal to each other. Turning on and off of the first switching MOS transistor M11, the second switching MOS transistor M12, the third switching MOS transistor M13, the fourth switching MOS transistor M14 and the fifth switching MOS transistor M15 are controlled by controlling their gate voltages with a control circuit that is not shown in the figure according to a voltage level of the clock Φ, as will be described hereafter.

Figure 5:
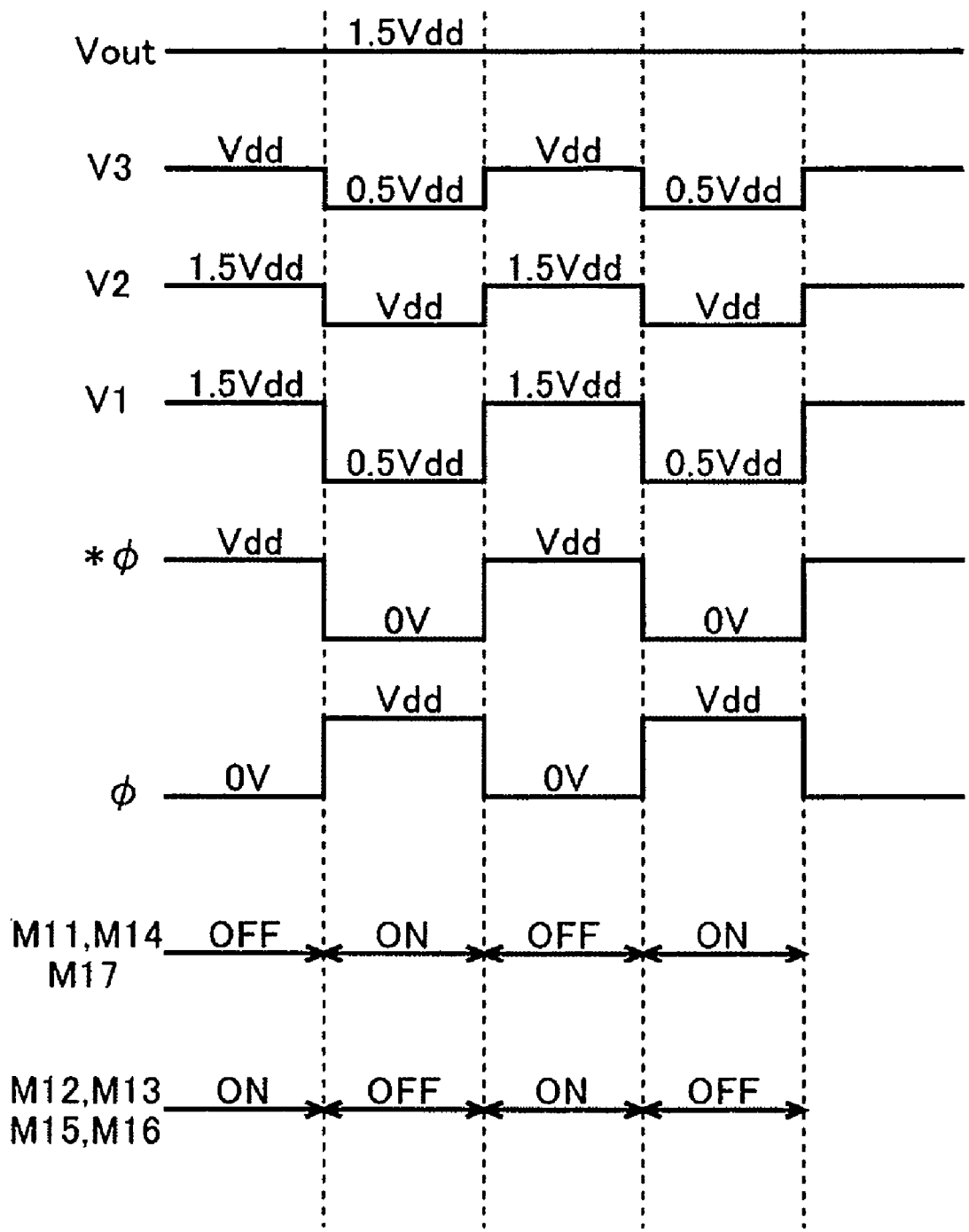
FIG. 5 is a timing chart showing operation of the 1.5 Vdd generation circuit according to the prior art.

Next, operation of the circuit will be explained referring to FIGS. 4A and 4B and FIG. 5. FIG. 5 is a timing chart showing the operation of this charge pump circuit in a stationary state.

The operation of the charge pump circuit when the clock Φ is at the high level will be described first (Refer to FIG. 4A and FIG. 5.). An N-channel type MOS transistor M17 of the clock driver CD is turned on and a reverse clock *Φ is at the low level (0V). The first switching MOS transistor M11 and the fourth switching MOS transistor M14 are turned on while the second switching MOS transistor M12, the third switching MOS transistor M13 and the fifth switching MOS transistor M15 are turned off. As a result, the first switching MOS transistor M11, the second capacitor C2, the fourth switching MOS transistor M14, the first capacitor C1 and the N-channel type MOS transistor M17 of the clock driver CD are connected in series between the power supply Vdd and the ground Vss as indicated with a dashed bold line in FIG. 4A, and the first capacitor C1 and the second capacitor C2 are charged. A voltage V11 at the terminal of the second capacitor C2 is charged to Vdd, a voltage V12 at the another terminal of the second capacitor C2 is charge to 0.5 Vdd and a voltage V13 at the another terminal of the first capacitor C1 is also charged to 0.5 Vdd.

The operation of the charge pump circuit when the clock Φ is at the low level will be described next (Refer to FIG. 4B and FIG. 5.). The P-channel type MOS transistor M16 of the clock driver CD is turned on and the reverse clock *Φ is at the high level. The first switching MOS transistor M11 and the fourth switching MOS transistor M14 are turned off while the second switching MOS transistor M12, the third switching MOS transistor M13 and the fifth switching MOS transistor M15 are turned on.

As a result, 1.5 Vdd is provided to the output terminal through two paths indicated with solid bold lines in FIG. 4B. Charges in the second capacitor C2 is discharged to provide the output terminal with 1.5 Vdd through one of the paths that runs from the power supply Vdd to the output terminal through the third switching MOS transistor M13, the second capacitor C2 and the second switching MOS transistor M12. The voltage V12 at the another terminal of the second capacitor C2 has been charged to 0.5 Vdd when the clock Φ is at the high level. The voltage V11 at the terminal of the second capacitor C2 is pulled up from Vdd to 1.5 Vdd by capacitive coupling through the second capacitor C2 when the voltage V12 varies from 0.5 Vdd to Vdd by turning-on of the third switching MOS transistor M13.

Charges in the first capacitor C1 is discharged to provide the output terminal with 1.5 Vdd through another of the paths that runs from the power supply Vdd to the output terminal through the P-channel type MOS transistor M16 of the clock driver CD, the first capacitor C1 and the fifth switching MOS transistor M15.

The voltage V13 at the another terminal of the first capacitor C1 has been charged to 0.5 Vdd when the clock Φ is at the high level. The voltage V13 at the another terminal of the first capacitor C1 is pulled up from 0.5 Vdd to 1.5 Vdd by capacitive coupling through the first capacitor C1 when the voltage at the terminal of the first capacitor C1 varies from 0V to Vdd by turning-on of the P-channel type MOS transistor M16.

The output voltage Vout of 1.5 Vdd that is the power supply voltage Vdd multiplied by 1.5 is obtained by alternately repeating the operation when the clock Φ is at the high level and the operation when the clock Φ is at the low level.

Descriptions above make it clear that the first switching MOS transistor M1, the second switching MOS transistor M2, the third switching MOS transistor M3, and the fifth switching MOS transistor M5 in the −0.5 Vdd generation circuit 40 need to be N-channel type while the first switching MOS transistor M11, the second switching MOS transistor M12, the third switching MOS transistor M13, and the fifth switching MOS transistor M15 in the 1.5 Vdd generation circuit 60 need to be P-channel type. Table 1 shows numbers of transistors used in the two circuits assuming that the fourth switching MOS transistor M4 in the −0.5 Vdd generation circuit 40 is P-channel type and the fourth switching MOS transistor M14 in the 1.5 Vdd generation circuit 60 is N-channel type, and that the clock driver CD in each of the two circuits is made of a P-channel type MOS transistor and an N-channel type MOS transistor. More N-channel type MOS transistors are used in the −0.5 Vdd generation circuit 40 that includes five N-channel type MOS transistors and two P-channel type MOS transistors than in the 1.5 Vdd generation circuit 60 that includes two N-channel type MOS transistors and five P-channel type MOS transistors. Assuming a ratio of a patterning area of a P-channel type MOS transistor to that of an N-channel type MOS transistor is 3:1, a ratio of patterning area (for transistors only) of the 1.5 Vdd generation circuit 60 to that of the −0.5 Vdd generation circuit 40 is about 17:11. In other words, the −0.5 Vdd generation circuit 40 takes 35% less patterning area compared with the 1.5 Vdd generation circuit 60. A total patterning area of the driver circuit can be reduced accordingly.

TABLE 1

Comparison of patterning areas between the 1.5 Vdd generation circuit and the −0.5 Vdd generation circuit

|  | 1.5 Vdd generation circuit | −0.5 Vdd generation circuit |
| --- | --- | --- |
| number of P-channel type MOS transistors | 5 | 2 |
| number of N-channel type MOS transistors | 2 | 5 |
| patterning area | 17 | 11 |

In addition, current consumption in the driver circuit can be reduced to improve efficiency, because parasitic capacitance of the gates of the MOS transistors and of others can be reduced.

It should be noted that this invention can be applied not only to the driver circuit of the white LED but also to a driver circuit of a red LED, a green LED, a blue LED, other light emitting devices having an anode and a cathode or the like.

Although the negative voltage of −0.5 Vdd is generated and a voltage difference of 1.5 Vdd is obtained between the negative voltage and the power supply voltage Vdd in the embodiment, the negative voltage is not limited to −0.5 Vdd. It may be −0.4 Vdd, −0.6 Vdd or other voltages.

Since a negative voltage generation circuit is used in this invention instead of a positive voltage generation circuit used in a prior art, N-channel type MOS transistors are heavily used, resulting in a reduced patterning area for MOS transistors compared with the positive voltage generation circuit. A patterning area for the driver circuit can be reduced accordingly. Because the patterning area for the MOS transistors is reduced, accompanying parasitic capacitance is reduced also, leading to reduced current consumption and improved efficiency of the driver circuit.

What is claimed is:

1. A driver circuit that is connected to a light emitting device to supply a current to the device, comprising:
    a driver transistor that provides the light emitting device with the current; and
    a negative voltage generation circuit that generates a negative voltage based on a positive power supply voltage supplied to an anode of the light emitting device, the negative voltage being supplied to a cathode of the light emitting device through the driver transistor,
    wherein the negative voltage generation circuit comprises
        a first switching device having an input terminal to which a ground voltage is applied,
        a second switching device connected to the first switching device in series,
        a first capacitor comprising a terminal to which a clock is applied,
        a second capacitor comprising a terminal that is connected to a connecting point between the first switching device and the second switching device,
        a third switching device connected between another terminal of the second capacitor and a ground that is at the ground voltage,
        a fourth switching device connected between another terminal of the first capacitor and the another terminal of the second capacitor, and
        a fifth switching device connected between the another terminal of the first capacitor and an output terminal of the second switching device, and
    wherein the first switching device and the fourth switching device are turned on so that the first capacitor and the second capacitor are connected in series between a clock source and the ground through the first switching device and the first and second capacitors are charged when the clock source supplies a first voltage as the clock, and
    the fifth switching device is turned on so that the first capacitor is connected between the ground and the output terminal for the first capacitor to be discharged, and the second switching device and the third switching device are turned on so that the second capacitor is connected between the ground and the output terminal through the second switching device for the second capacitor to be discharged when the clock source supplies a second voltage as the clock.

2. The driver circuit of claim 1, wherein the negative voltage has a magnitude equal to half of a magnitude of the positive power supply voltage.

3. The driver circuit of claim 1, wherein each of the first switching device, the second switching device, the third switching device and the fifth switching device comprises an N-channel type MOS transistor.

4. The driver circuit of claim 3, wherein the fourth switching device comprises an N-channel type MOS transistor.

5. The driver circuit of claim 3, wherein the fourth switching device comprises a P-channel type MOS transistor.

6. The driver circuit of claim 1, wherein the driver transistor comprises an N-channel type MOS transistor operating as part of a current mirror.

7. The driver circuit of claim 1, wherein the light emitting device comprises a white light emitting diode.

* * * * *